(12) United States Patent
Wilkerson et al.

(10) Patent No.: US 7,545,138 B2
(45) Date of Patent: *Jun. 9, 2009

(54) PRECISION, TEMPERATURE-COMPENSATED, SHIELDED CURRENT MEASUREMENT DEVICE

(75) Inventors: Donovan E. Wilkerson, Pullman, WA (US); Veselin Skendzic, Pullman, WA (US); James R Kesler, Pullman, WA (US)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/456,007

(22) Filed: Jul. 6, 2006

(65) Prior Publication Data

US 2008/0007249 A1  Jan. 10, 2008

(51) Int. Cl.
*G01R 15/18* (2006.01)
*G01R 1/20* (2006.01)
*G01R 33/02* (2006.01)

(52) U.S. Cl. .................. 324/127; 324/126; 324/252

(58) Field of Classification Search ......... 324/126–127; 336/173–177, 180, 182, 188, 200, 220–221, 336/229

See application file for complete search history.

(56) References Cited

U.S. PATENT DOCUMENTS

| 1,942,575 A | 1/1934 | Shapiro |
| 2,599,550 A | 6/1952 | Fraser |
| 2,845,562 A | 7/1958 | Bendell |

(Continued)

FOREIGN PATENT DOCUMENTS

EP  0573 350 B1  12/1993

(Continued)

OTHER PUBLICATIONS

John D. Ramboz, Machinable Rogowski Coil, Design and Calibration, IEEE Transactions on Instrumentation and Measurement, Apr. 2, 1996, pp. 511-515, vol. 45, No. 2.

(Continued)

*Primary Examiner*—Ha Tran T Nguyen
*Assistant Examiner*—Joshua Benitez
(74) *Attorney, Agent, or Firm*—Eugene M. Cummings, P.C.

(57) ABSTRACT

A current measurement device using a Rogowski coil having a generally toroidally shaped core with flattened faces, a first winding in one direction, a second winding forming a return loop, and a temperature compensation and scaling network coupled to the coil. The core has concentric cavities and a rough surface to restrain movement of the coil winding. A Faraday shield is wrapped over the coil. One shield is "serpentine," having staggered (offset) lateral extensions from a central region. An alternate shield has a generally circular central region with extensions in generally radial directions. The shield is formed of three layers comprising a non-ferromagnetic metal central layer surrounded by insulative layers. At an end tab of the shield, the metal layer is exposed for connection to a ground lug or other connector. An insulative housing envelops the coil and electrical network. An output wire terminates in an industrial connector. A resistive network may be implemented with the current measurement device. The resistive network may be balanced or unbalanced. The resistive network may be capable of signal attenuation of an output, capable of calibration of an output, or provide temperature compensation of an output.

31 Claims, 13 Drawing Sheets

U.S. PATENT DOCUMENTS

| | | | |
|---|---|---|---|
| 3,684,955 A | 8/1972 | Adams | |
| 3,942,029 A | 3/1976 | Kawakami | |
| 4,616,176 A | 10/1986 | Mercure et al. | |
| 4,700,131 A * | 10/1987 | Miller | 324/117 H |
| 4,709,205 A | 11/1987 | Baurand et al. | |
| 4,799,005 A | 1/1989 | Fernandes | |
| 4,803,425 A | 2/1989 | Swanberg | |
| 4,808,959 A * | 2/1989 | Weissman | 336/189 |
| 4,810,954 A | 3/1989 | Fam | |
| 4,831,327 A | 5/1989 | Chenier et al. | |
| 5,012,218 A | 4/1991 | Haug et al. | |
| 5,055,816 A | 10/1991 | Altman | |
| 5,066,904 A | 11/1991 | Bullock | |
| 5,223,790 A * | 6/1993 | Baran et al. | 324/127 |
| 5,272,460 A | 12/1993 | Baumgartner et al. | |
| 5,414,400 A | 5/1995 | Gris et al. | |
| 5,442,280 A | 8/1995 | Baudart | |
| 5,461,299 A * | 10/1995 | Bruni | 320/108 |
| 5,461,309 A | 10/1995 | Baudart | |
| 5,627,475 A | 5/1997 | Strosser | |
| 5,831,506 A * | 11/1998 | Crepel | 336/187 |
| 5,852,395 A | 12/1998 | Bosco et al. | |
| 5,917,316 A * | 6/1999 | Bosco et al. | 324/126 |
| 5,982,265 A | 11/1999 | Von Skarczinski et al. | |
| 6,008,711 A * | 12/1999 | Bolam | 336/92 |
| 6,094,044 A | 7/2000 | Kustera et al. | |
| 6,137,394 A | 10/2000 | Holmes et al. | |
| 6,184,672 B1 * | 2/2001 | Berkcan | 324/117 R |
| 6,215,296 B1 | 4/2001 | Arnoux et al. | |
| 6,255,565 B1 * | 7/2001 | Tamura | 84/275 |
| 6,288,625 B1 | 9/2001 | Kaczkowski | |
| 6,300,857 B1 * | 10/2001 | Herwig | 336/229 |
| 6,313,623 B1 | 11/2001 | Kojovic et al. | |
| 6,351,114 B1 | 2/2002 | Iwasaki | |
| 6,366,076 B1 | 4/2002 | Karrer et al. | |
| 6,380,727 B1 | 4/2002 | Jitaru | |
| 6,420,952 B1 * | 7/2002 | Redilla | 336/84 M |
| 6,437,555 B1 | 8/2002 | Ploch et al. | |
| 6,566,854 B1 | 5/2003 | Hagmann | |
| 6,614,218 B1 | 9/2003 | Ray | |
| 6,624,624 B1 * | 9/2003 | Karrer et al. | 324/117 R |
| 6,680,608 B2 | 1/2004 | Kojovic | |
| 6,822,547 B2 | 11/2004 | Saito et al. | |
| 6,825,650 B1 | 11/2004 | McCormack et al. | |
| 6,940,702 B2 | 9/2005 | Kojovic et al. | |
| 7,009,486 B1 | 3/2006 | Goeke | |
| 7,106,162 B2 | 9/2006 | Saito | |
| 7,109,838 B2 | 9/2006 | Brennan | |
| 7,227,441 B2 | 6/2007 | Skendzic | |
| 7,227,442 B2 | 6/2007 | Skendzic | |
| 2003/0090356 A1 | 5/2003 | Saito et al. | |
| 2004/0008461 A1 | 1/2004 | Kojovic et al. | |
| 2004/0012901 A1 | 1/2004 | Kojovic et al. | |
| 2004/0178875 A1 | 9/2004 | Saito | |
| 2005/0052268 A1 * | 3/2005 | Pleskach et al. | 336/200 |
| 2005/0156587 A1 | 7/2005 | Yakymyshyn | |
| 2005/0156703 A1 * | 7/2005 | Twaalfhoven | 336/229 |
| 2006/0174834 A1 * | 8/2006 | Long et al. | 118/723.001 |
| 2006/0176140 A1 * | 8/2006 | Skendzic et al. | 336/225 |
| 2006/0232263 A1 * | 10/2006 | Kovanko et al. | 324/127 |
| 2006/0232265 A1 * | 10/2006 | Fritsch et al. | 324/142 |

FOREIGN PATENT DOCUMENTS

| | | |
|---|---|---|
| EP | 0587491 B1 | 3/1994 |
| EP | 0652 441 A1 | 6/1995 |
| EP | 0808460 B1 | 11/1997 |
| EP | 0889490 A2 | 1/1999 |
| EP | 0889490 A3 | 1/1999 |
| JP | 2001102230 A | 4/2001 |
| JP | 2003173922 A | 6/2003 |
| JP | 2004228296 A | 8/2004 |
| WO | WO 00/72027 A1 | 11/2000 |
| WO | PCT/US2007/015557 | 1/2008 |

OTHER PUBLICATIONS

A Combined Current And Voltage Sensor For Metering And Protection In High Voltage Power Systems—W.Z. Fam, Fellow IEEE.

* cited by examiner

PRECISION, TEMPERATURE-COMPENSATED, SHIELDED CURRENT MEASUREMENT DEVICE

BACKGROUND OF THE INVENTION

The present invention concerns a precision current measurement device, typically involving a Rogowski coil.

Rogowski coils are well known electrical devices finding use today for measurement of magnetic fields and electrical currents. They have been researched over the past century and are well known to the scientific literature. Their origin traces to the invention circa 1912 of the Rogowski coil by W. Rogowski and W. Steinhaus. The device is useful for measuring electrical currents and operates on the basis of a magnetic field integration performed across a closed contour being proportional to the current flowing through the contour. The coil provides a voltage output that is proportional to the time derivative of the current (di/dt) rather than a current output like other current transformers.

Rogowski coils are popular because of their dynamic range and linearity. However, though theoretical requirements are known, manufacturers still need ways to provide a high quality coil that is both economical to manufacture and which is satisfactory for precise current measurements. The device (coil) should be insensitive to external influences, insensitive to the measured primary conductor position, and retain high precision (in the order of 0.3% or better) over its lifetime and across a wide temperature range (nominally −40 to 85 degrees Centigrade).

There are several major requirements for implementing successful Rogowski Coil implementations. Return path cancellation, geometric symmetry, and electrostatic shielding are major requirements. A true Rogowski coil implementation must include a return path to eliminate the undesirable magnetic loop area created by the advancement of the coil winding. Many previous "Rogowski coil" implementations either ignore the return path compensation as in U.S. Pat. No. 5,852,395 or provide a poor approximation of the return path as in U.S. Pat. Nos. 6,437,555 and 5,414,400. In addition, several of these previous attempts at providing return path compensation are more difficult to manufacture, such as, for example, UK Patent Application number 2,259,150 to Frederick.

When the return path is omitted for a "Rogowski coil" device, it is commonly referred to in the art as a linear coupler, not as a Rogowski coil. When the return path is omitted or poorly approximated, the device exhibits excessive measurement sensitivity to the position and angle of the conductor within the device opening and susceptibility to magnetic fields produced by electric currents that are external to the device. Susceptibility to these externally generated magnetic fields will hereafter be referred to as "external magnetic field susceptibility."

Geometric symmetry of construction is another factor that contributes to positional and angular sensitivity of the placement of the conductor within the device opening and external magnetic field susceptibility. The individual conductor turns that make up the windings must be placed symmetrically, around the perimeter of the coil and concentrically around an imaginary axis in the center of the coil's conductor turns. In addition, the core must be fabricated with a method and material that prevents warpage and that provides for concentric thermal expansion.

With sufficient geometric control and return path cancellation, a Rogowski coil can provide very high accuracy at a specific temperature. Even with the best geometric control, however, the magnitude of the Rogowski coil output still remains sensitive to temperature change due to the coefficients of thermal expansion of the utilized materials. Nevertheless, as a result of sufficient geometric control, it is possible to temperature compensate the device output for a desired level of accuracy across a specific temperature range without incurring undesired positional sensitivity, angular sensitivity, or external magnetic field susceptibility.

Prior art exists that attempts to temperature compensate printed circuit boards; however, the printed circuit board materials have very poor Z-axis expansion and have poor thickness variation control. Common printed circuit boards are not monolithic, but are actually constructed by laminating numerous thin "prepreg" sheets (partially cured, fiber reinforced sheets that are preimpregnated with a resin) together. This construction can cause significant geometric control problems. As a result, temperature compensation is only partially effective without some other process to provide sufficient geometric control. In order to manage the relatively poor tolerances of the printed circuit board materials, a special culling process is required in order to obtain materials that do not have excessive thickness variation in the cross-sectional area.

One example of a Rogowski coil using a printed circuit is disclosed in U.S. Pat. No. 5,414,400 entitled "Rogowski Coil" which discloses a Rogowski coil made on a printed circuit plate provided with a circular cut-out. The coil is implemented by metal deposits on each of the two faces of the plate extending along radii, with electrical connections between the radii on one face and those on the opposite face being achieved via plated-through holes passing through the thickness of the plate.

U.S. Pat. No. 5,442,280 discloses a method for manufacturing a printed circuit board-based Rogowski coil. The disclosed geometry provides very high turn density resulting in very high sensitivity. While high sensitivity is very desirable when measuring low frequency currents (50/60 Hz power system related), the patent fails to provide adequate means for external magnetic field cancellation This problem is reported in U.S. Pat. No. 6,624,624 and is caused by inadequate handling of the coil return path.

The relatively long conductor of the coil winding is subject to electric field exposure in nearly any real world environment. As a result, electrostatic shielding must be included to prevent the winding from acting as a wideband antenna. Otherwise, the Rogowski coil output signal can be corrupted by surrounding sources of electromagnetic interference appearing as noise. It is known to provide shielding around a coil. For example, Kaczkowski U.S. Pat. No. 6,288,625 entitled "Current Transformer For A Metal-Enclosed Gas-Insulated Hi-Voltage Installation" includes electrically conducting walls that act as a "screen" around a pickup coil that is wound around an annular core and surrounded by an electrically insulating compound. See also EP0889490 (Kaczkowski) and having the same title.

Von Skarczinski et ale U.S. Pat. No. 5,982,265 is directed to a current detection coil for a current transformer. This says that it uses a Rogowski coil with an insulating annular body made of a fiber-reinforced thermosetting plastic mounted in a flame or housing. This patent does not disclose a return path for the coil.

A similar problem applies to the design reported in U.S. Pat. No. 6,313,623 (by one of the present inventors) in which two closely spaced coils with counter rotation are used to perform partial return path compensation.

Further attempts to design precision Rogowski coils are disclosed in U.S. Pat. No. 6,624,624. Attempts to provide improved return path cancellation resulted in significantly reduced coil densities, making the design less appropriate for low frequency current measurement applications. In addition, although improved, all reported geometries suffer from Z-axis (board thickness) related sensitivity effects with an error cancellation (return) path normally offset in the direction of the Z-axis (board thickness).

J. D. Ramboz in "Machinable Rogowski Coil, Design and Calibration," *IEEE Transactions on Instrumentation and Measurement*, Vol. 45, No. 2, (April 1996) pp 511-15 reviews traditional designs for Rogowski coils and discusses a "machinable" Rogowski coil constructed using machinable ceramic material to make a toroidal coil with a rectangular cross section. A thin, electrically conductive coating is then applied to the coil, totally encapsulating the ceramic core. Next, thin lines of the conductive material are removed by laser machining methods in a pattern that leaves coils as bands of conductive material located radially around the core. Each turn or band was connected to the next turn by a suitable indexing.

U.S. Pat. No. 6,300,857 for "Insulating Toroid Cores and Windings" discloses a configuration to improve the winding of precise conventional transformer coils and includes an insulating jacket around a magnetic core. The insulating jacket includes plural protrusions around the core, the protrusions demarking various segments of the toroid. For example, the toroid may be divided into six evenly spaced sections, each occupying approximately 60°. At the edges of each section, there is a protrusion. The protrusions maintain the placement and spacing of windings within each section.

An object of the present invention is to provide a precision di/dt transducer that addresses various problems of the prior art to provide a precise, practical, and manufacturable electric current measuring device using a Rogowski coil.

A further object is to improve the core structure for a Rogowski or other coil.

Yet another object is to provide an improved shield for Rogowski or other coils.

SUMMARY OF THE INVENTION

A precision current measuring apparatus is based on a Rogowski coil that is preferably of the wound coil type. According to certain aspects of the present invention, the coil includes a generally toroidal (or toroid-like) core which preferably has cavities therein. Preferably the coil is formed by a single conductive wire coiled about the core substantially over the full 360 degrees of the core in a first winding and then forming a return winding that is coiled on top of the first winding. Preferably the first and second windings are helical. In one embodiment, the first and second windings may have the same number of turns. Preferably the coils are held in place by a rough surface of the core together with varnish or another sealant or encapsulant.

An independent aspect of the present invention is a Faraday shield having a unique configuration. It is used in the preferred embodiment for surrounding the wound core. Preferably but not necessarily the Faraday shield has a "serpentine" configuration when laid flat, before being affixed to (wrapped around) the wound core. An alternative embodiment has a somewhat circular or star-shaped configuration when laid flat, before being wrapped around the wound core.

Another feature of the present invention is a resistive network used for temperature compensation and scaling.

Preferably the current measuring device is enclosed in an insulative housing having a circular opening that receives the core and preferably provides a region to support the resistive network. Preferably the Faraday shield is electrically coupled to a ground lug or other grounding apparatus. Preferably the output of the device is provided on an interface cable which preferably extends through an aperture in the housing therefore Preferably the interface cable is fitted with an industrial-grade connector.

BRIEF DESCRIPTION OF THE DRAWINGS

In describing preferred embodiments of the present invention, reference is made to accompanying drawings wherein like parts bear similar reference numerals and wherein.

DESCRIPTION OF PREFERRED EMBODIMENTS

A preferred embodiment of the present invention is shown in the accompanying figures as a measuring device 10 for measuring the time derivative of alternating current in a conductor passed through an opening in device 10. Measuring device 10 is based upon the basic concept of the Rogowski coil. The electrical output of the coil may be integrated and scaled in order to derive the alternating current signal for a conductor that is passed through an opening within the shape enclosed by the coil winding. This output may then be used in, for example, an intelligent electronic device (IED) such as a relay for determining the health of an electric power system. This is one specific application, and persons skilled in the art could apply this invention to other applications requiring current vector information such as, for example, current magnitude or phase information. Further, the output could be used in conjunction with other measured power system quantities, such as voltage, to calculate Watts, Vars, or apparent power.

Figure 1A:
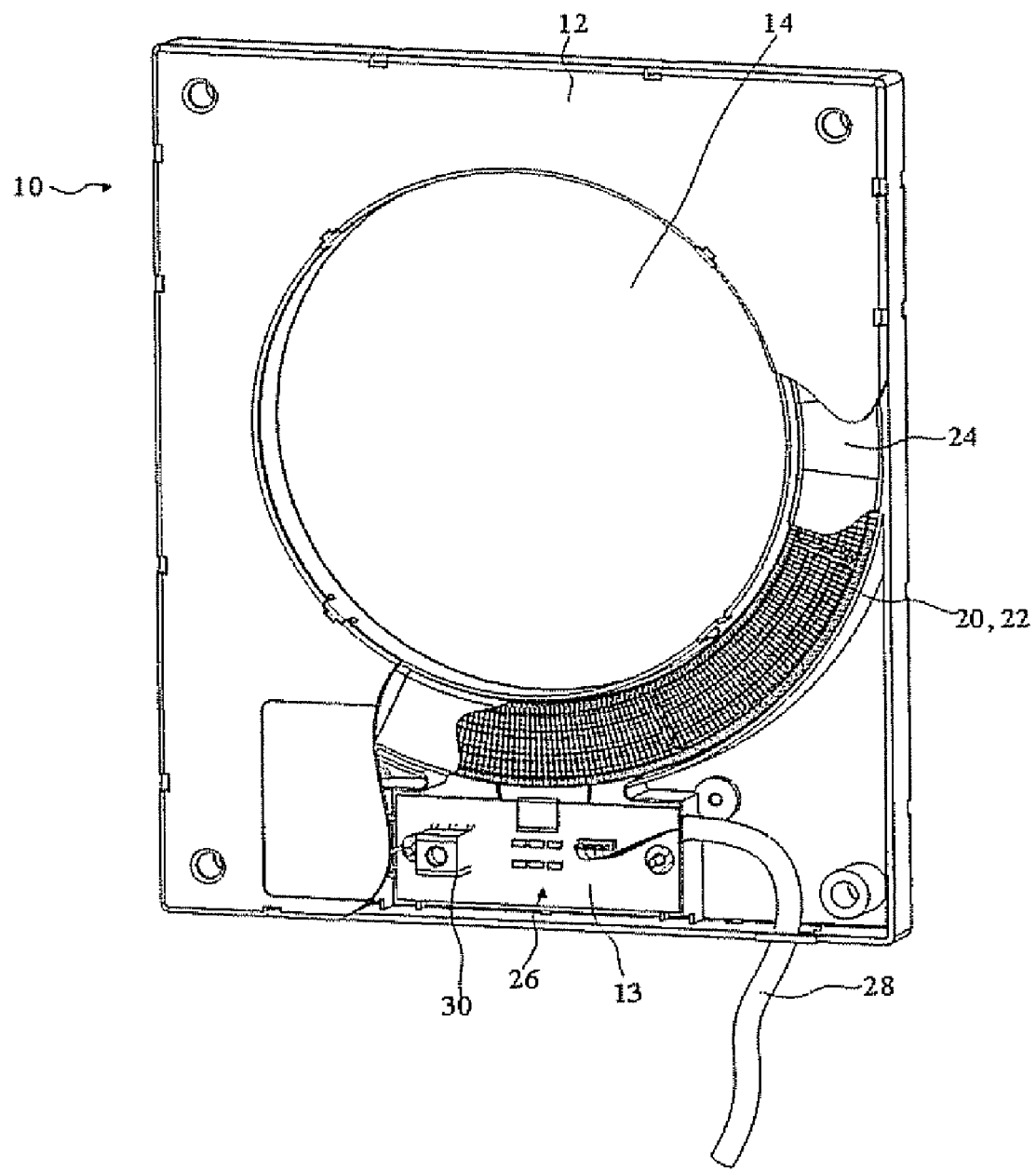
FIGS. 1A and 1B are perspective views with parts broken away of a measurement device embodying various aspects of the present invention.
Figure 1B:
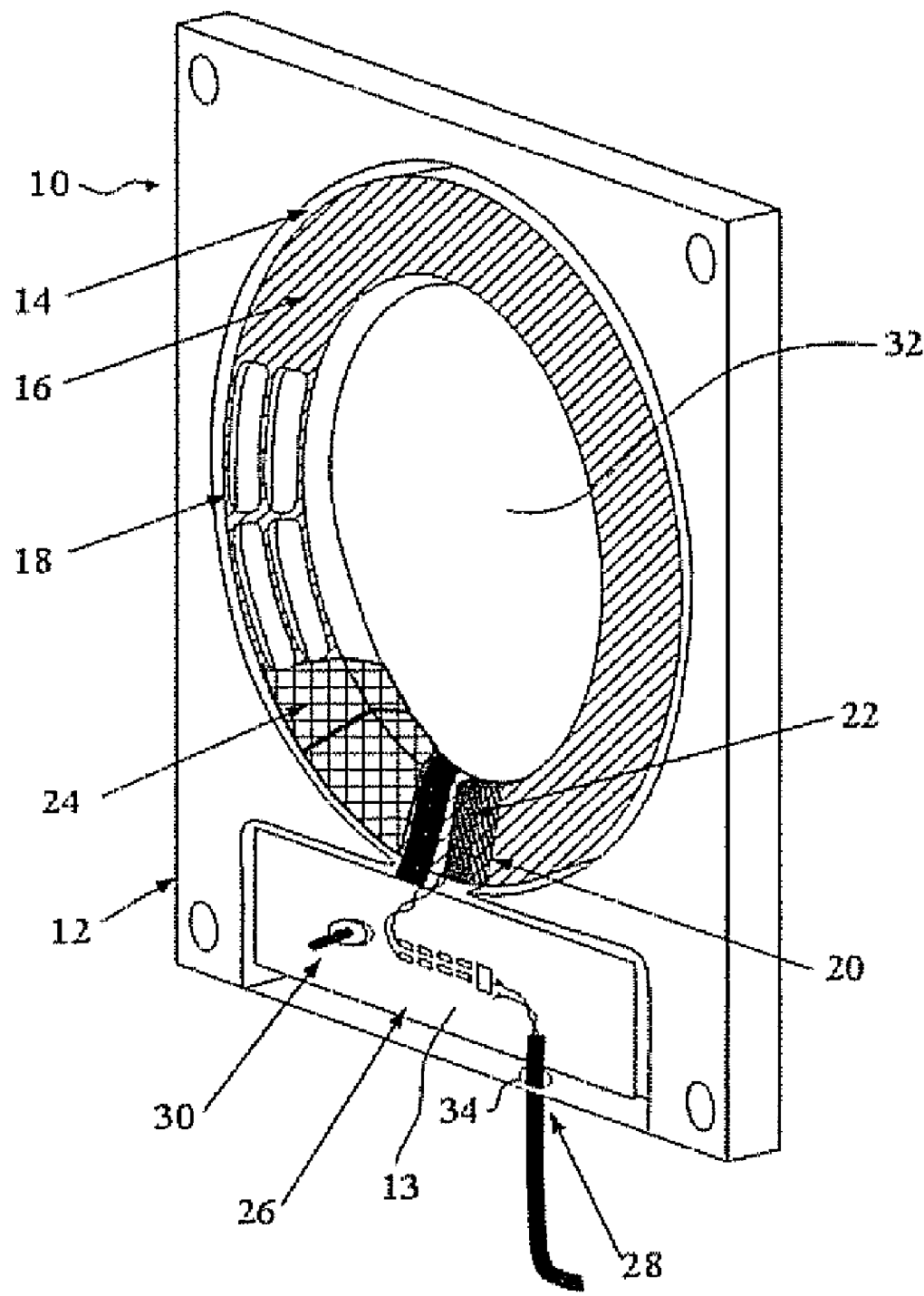

FIGS. 1A and 1B are perspective views with parts broken away of measurement device 10 embodying various aspects of the present invention. FIG. 1B has further parts broken away and shows more details of the device. Device 10 includes a housing 12 that may be generally rectilinear in overall shape or have any other convenient shape. Generally, housing 12 fully encloses a Rogowski coil and other major components of the device, such as, for example, electrical circuitry on a circuit board 13. Housing 12 includes a central opening 14 which is typically, but not necessarily, circular. Housing 12 receives and houses a coil, which has a core 16. The core itself is not shown in FIG. 1A but is partially exposed in FIG. 1B As shown there, core 16 preferably includes a plurality of cavities 18. Core 16 is preferably wound with first and second helical windings 20 and 22 (shown partially in FIG. 1A). The wound core (i.e., the core with the coiled wire wrapped around it) is preferably surrounded by a Faraday shield 24 (shown partially in FIGS. 1A and 1B). A compensation and scaling network 26 is located within or upon circuit board 13 within housing 12. An interface cable 28 connects to the network 26. Also, a ground lug 30 may be associated with the circuit board 13. In FIG. 1A, the lug is shown as a raised post with a threaded aperture so that a grounding wire can be connected. In FIG. 1B, an alternate arrangement is shown where a lug is exposed but without the threaded aperture to facilitate connection to ground. In FIGS. 1A and 1B, circuit board 13 and scaling network 26 are located adjacent to core 16, illustratively, and in the figures are shown just beyond the central opening 14 of housing 12.

Figure 2A:
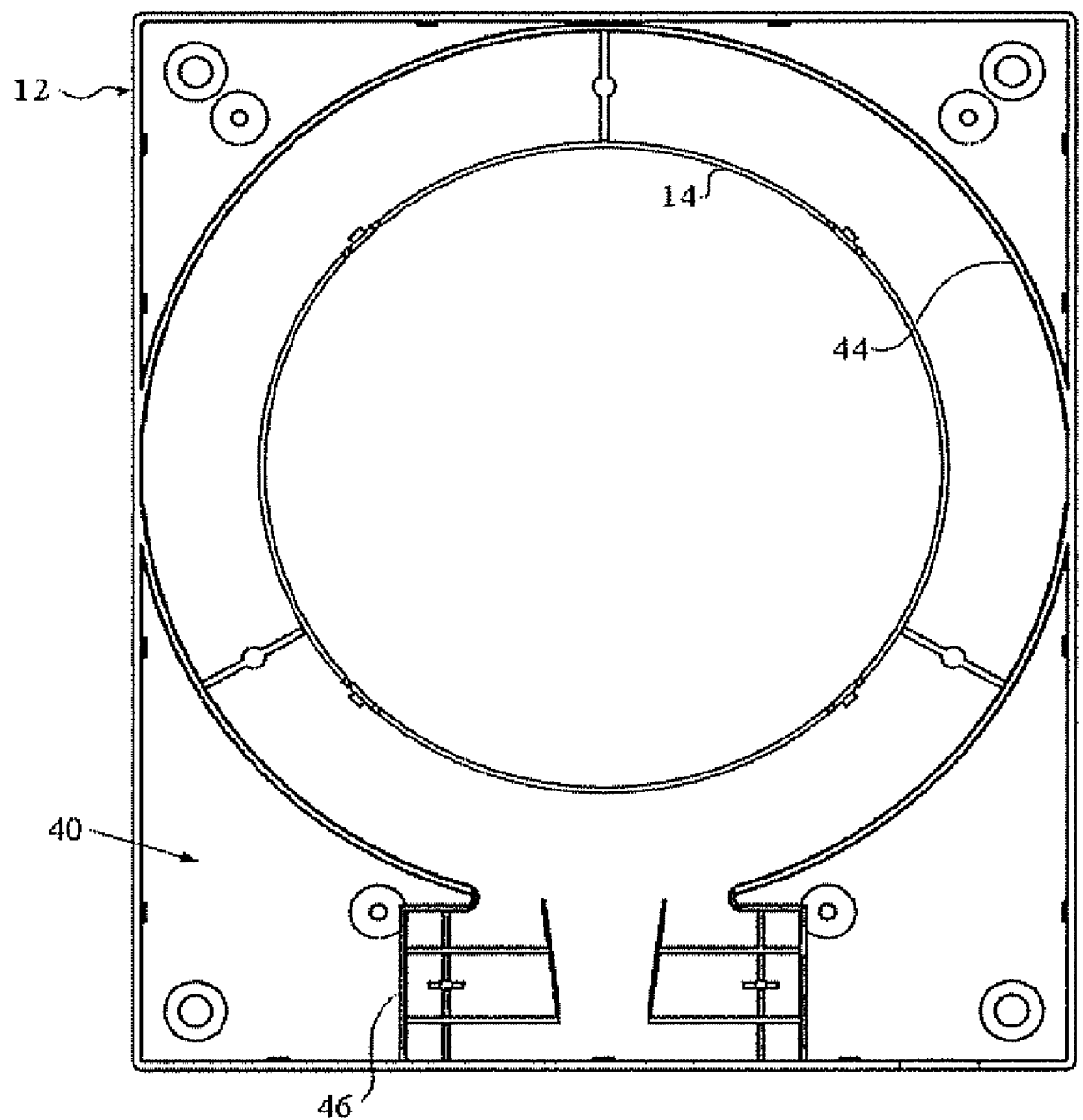
FIGS. 2A and 2B are plan views of the housing of the device of FIGS. 1A and 1B.
Figure 2B:
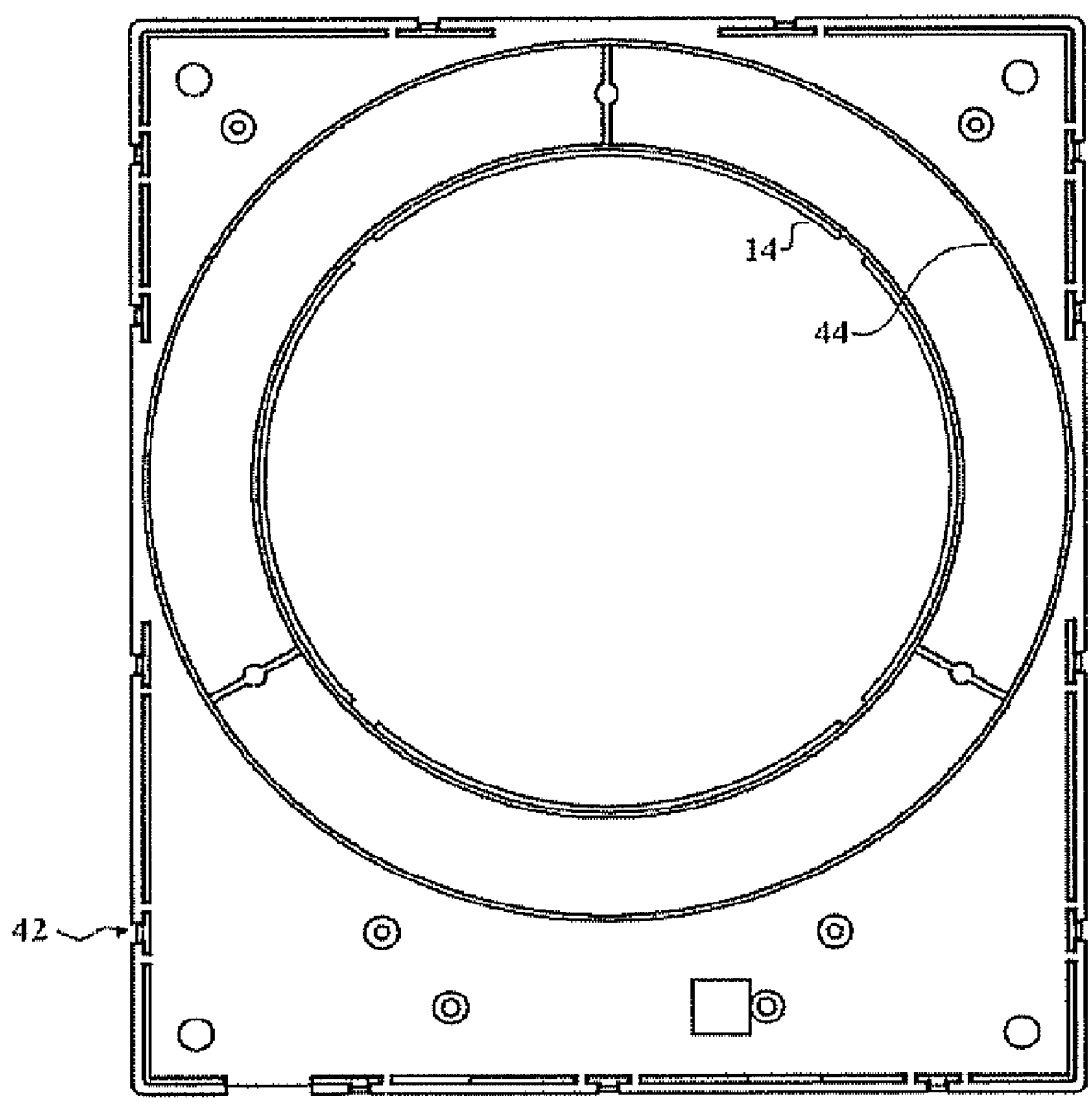

FIG. 2A shows a bottom member 40 of housing 12, and FIG. 2B shows a top member of housing 12. The prominent feature of FIGS. 2A and 2B is the "O" shape that in this embodiment extends across the full width of housing 12. This "O" shape is a track having an inside radius wall referred to earlier as opening 14 and an outside radius wall 44. It will be understood that the track shape will correspond to the shape of core 16, which need not be exactly circular but which could be oval, oblong, or basically any substantially closed loop. In such case, the track will be shaped correspondingly to support the core with wire coiled around it as discussed herein. In the embodiment shown in these figures, the coil is annular and hence the track for supporting it is also annular.

As seen in FIG. 2A, a set of rectilinear walls 46 are located below annular walls 14 and 44. As will be understood, walls 46 partially frame a generally rectangular area. Preferably but not necessarily that rectangular area communicates with the track formed by annular walls 14 and 44. Thus it can be seen that in the bottom member 40, the annular "O" has an open bottom. In this rectangular area, housing 12 receives circuit board 13. In one embodiment, the material for housing 12 is Lexan® EXL 9335, available from General Electric Company (Pittsfield, Mass.).

Measurement device 10 includes a Rogowski coil which in the preferred embodiment comprises a coil of wire, preferably magnet wire, wrapped around a core. The preferred core 16 preferably has the shape of a flattened toroid with a central opening 32 used for the passage of an AC conductor (not shown) whose current (or rate of current change with time) is to be determined. As evident from the preceding discussion of the track in the housing 12, the overall shape of the core and coil may be circular, oval, oblong, or another substantially closed loop.

Device 10 solves the problem of geometric symmetry by the choice of core material, the core design, the method of core fabrication, the method of winding, and the winding encapsulation. A dimensionally stable material is used for the (toroidal or other shaped) core 16. It is fabricated preferably from a moldable, rigid, glass-reinforced, polymer (insulating plastic). This material is chosen to exhibit a low and relatively linear coefficient of thermal expansion across and beyond the industrial temperature range (−40 to +85 C) for excellent overall dimensional stability of the core 16. Preferably core 16 comprises a non ferro-magnetic, electrical insulator, preferably one with a minimal coefficient of thermal expansion, and more preferably a moldable polymeric material. Illustratively, core 16 may be made of Thermoset Polyester with thermal expansion coefficient in the order of 9 ppm/° C., glass reinforced thermoplastic polyester PET (36 ppm/° C.), glass reinforced epoxy (36 ppm/° C.) or ABS/polycarbonate (67 ppm/° C.). It is understood that other materials can be used to achieve a specific cost/performance target without diverging from the spirit of this invention Some examples of core materials that may be used include Noryl® SE1GFN3 (available from General Electric Company, Pittsfield, Mass.) which is 30% glass reinforced and has a coefficient of thermal expansion of 25 ppm/° C., and Valox® 420 (available from General Electric Company, Pittsfield, Mass.). The core can be molded or may be machined, as convenient.

Figure 3A:
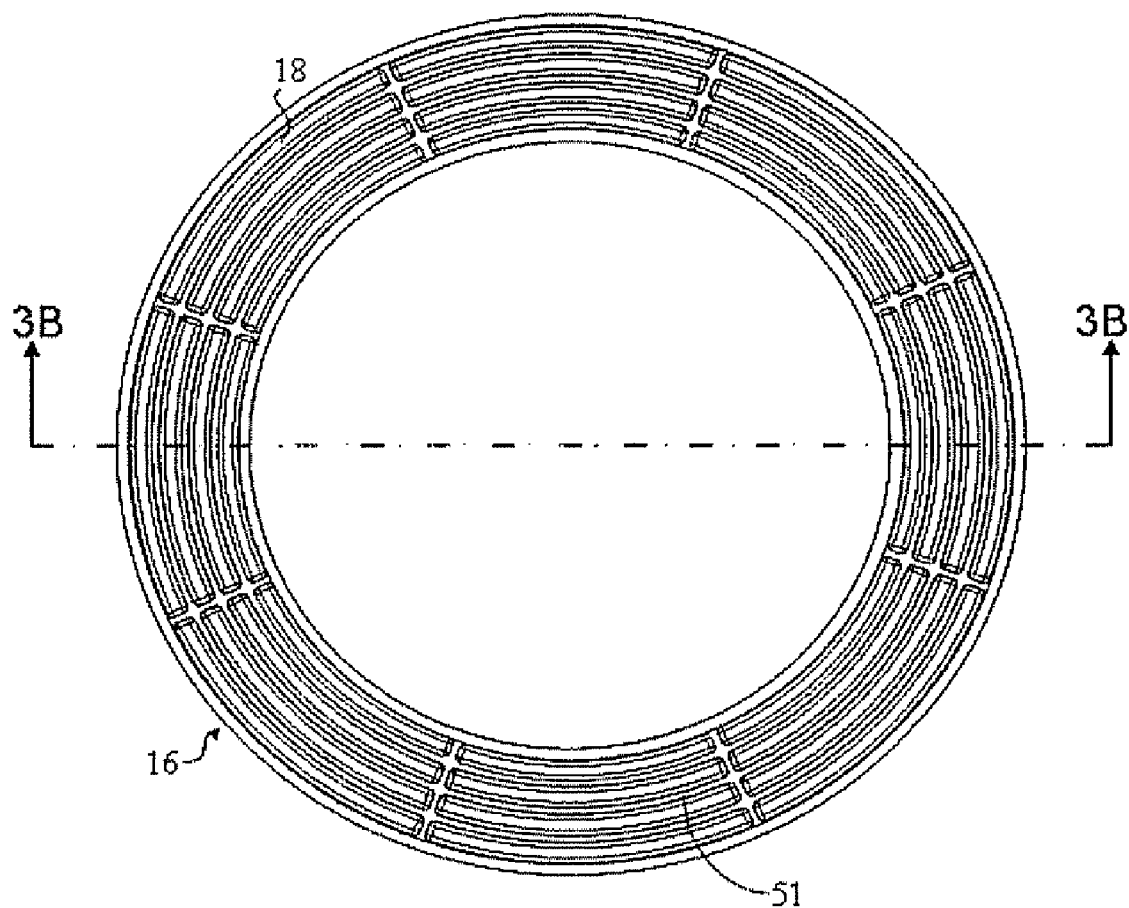
FIGS. 3A and 3B are plan and sectional views of a core according to aspects of the present invention.
Figure 3B:
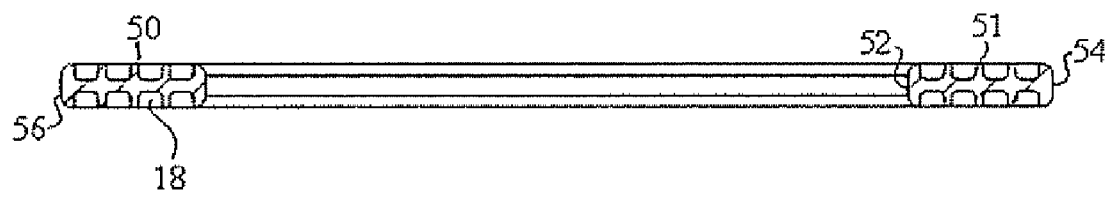
Figure 11A:
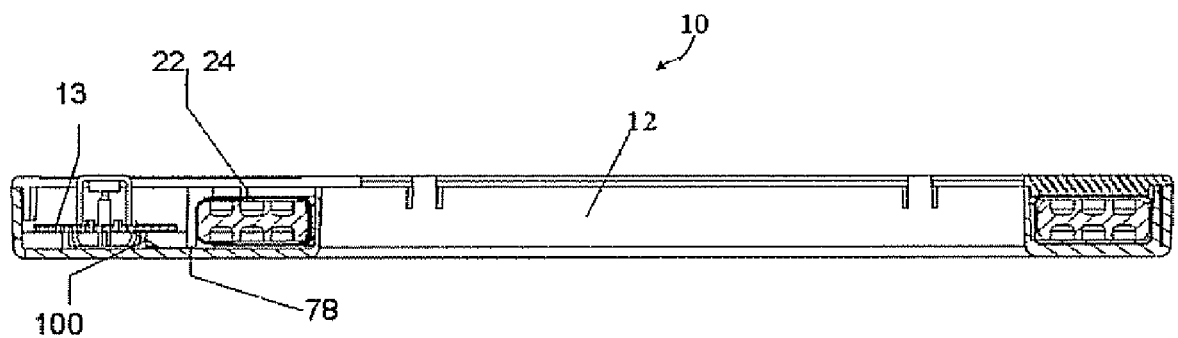
FIGS. 11A and 11B show the relationship of the end tab of the Faraday shield to the housing, a circuit board, and the circuitry of the device of FIGS. 1A and 1B.
Figure 11B:
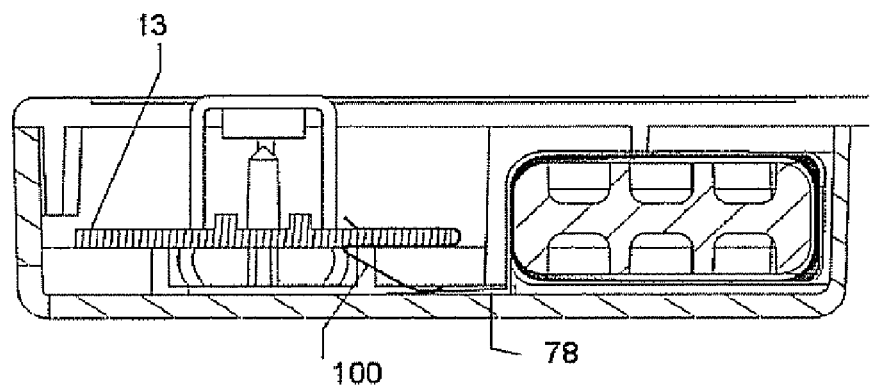

FIG. 3A is a plan view of a core 16, and FIG. 3B is a sectional view taken across the section line indicated in FIG. 3A. In the preferred embodiment device 10, cavities 18 are incorporated into the core 16 in order to improve the stability for injection molding while providing improved concentricity and warpage resistance compared to a solid core form. Preferably the cavities 18 do not extend completely through the core. Illustratively they are equal in depth and extend across the side surfaces of the core. Preferably the cavities are concentric and have periodic, radially-oriented structural ribs. FIGS. 3A and 3B illustrate an arrangement for a "large" coil having an inside diameter of 6.3 inches, an outside diameter of 8.2 inches, and a thickness of 0.375 inches, for example. A core of this size may include, illustratively, thirty two cavities 18 per side of the core. However, it will be understood that core 16 may vary widely in dimensions, illustratively on the order of 0.25 inch in outside diameter (or less) to eighteen or twenty inches, or more. The size of the core will affect the number and configuration of cavities therein. In one embodiment, as seen in FIGS. 3A and 3B, the core may have four concentric sets of cavities. An even number of concentric sets of cavities allows for a structural rib 51 to be placed about midway between the inside and outside diameters of the core. This structural rib 51 may provide added support to the windings 20 and 22 at the points where individual turns of the second winding 22 cross or overlap with individual turns of the first winding 20. As stated above, any number of cavities 18 may be used. Any number (even or odd) of concentric sets of cavities 18 may be used. FIG. 11, for example, shows a cross section of a device 10 using a core with three sets of concentric cavities 18.

From FIG. 3B, one can see that the preferred core has substantially flat side faces 50, a substantially flat inside face 52, and a substantially flat outside face 54. This is sometimes called a "flattened toroid" or "flattened torus." Faces 50, 52, and 54 in cross section (as seen in FIG. 3B) form a rectangle with rounded or chamfered inside and outside corners 56. Cavities 18 are arranged illustratively in eight sectors of 45 degrees or arc section each. Illustratively, each sector has three cavities 18 ganged together, side-by-side. FIG. 3B shows that cavities 18 extend inward from each side face 50 of core 16. For a smaller core, a single cavity per sector might be used. The representation in FIG. 1B shows a medium size core having two cavities 18 per sector. As seen in FIG. 3B, cavities are preferably located on both of side faces 50. The cavities on one side face 50 extend inward toward the cavities on the other side face 50 but preferably do not communicate with each other. That is, each cavity 18 in the preferred embodiment is discrete. Other arrangements can be used without departing from the scope or spirit of this invention. For example, cavities may be radially oriented instead of annularly oriented. They need not be ganged together as in FIGS. 3A and 3B. They need not be adjacent to one another. The cavities impart strength to the core and reduce its weight.

Core 16 may be blow molded, for example. Preferably no mold release compounds or lubricants are used in that process.

The core 16 has a slightly roughened texture on its outer surfaces in order to prevent wire movement within the first winding layer 20 during manufacturing. The roughened texture is obtained by any of several well-known suitable processes. For example, the roughness may be molded directly into the surface to have a texture such as Mold-Tech 11020 texture. Alternatively, after the core is formed, texturing can be added by a secondary process such as bead blasting or electro discharge machining. The degree of roughness or depth of texture should be sufficient to prevent wire slippage but not so great that it encourages or causes misplacement of wire during winding on the core 16 surface or thereafter.

Core 16 may generally be shaped as a toroid. The term "toroid" often connotes a "doughnut" shape but the present invention does not require a "doughnut" shape for core 16. A cross section cut from the inside to the outside radius of core 16 can be circular, substantially rectangular, or otherwise, e.g., oval, oblong, or some other shape. That is, core 16 may have the geometric shape of a solid formed by revolving (orbiting) a closed form, be it a circle, square, rectangle, oval, oblong, or irregular shaped closed line, substantially 360 degrees around an axis external to the closed form being revolved. The axis may be orthogonal to a centerline of the revolved shape. The distance between the revolved shape and the external axis may be varied to create elliptical, oblong, or other complex core solids. Thus, a Rogowski coil according to certain aspects of the present invention may be used where the core 16 has generally "flattened" faces (like an annulus or washer), which could be formed geometrically by revolving a rectangle with rounded corners a complete 360 degrees around an orthogonal axis that is located a fixed distance from, and external to, the rectangle, as in FIGS. 3A and 3B. Another embodiment may use another shape for core 16, still according to aspects of the present invention, where the faces are not flattened but instead are rounded with a circular cross section (somewhat like an O-ring). That geometric form could be obtained by similarly revolving a circle around 360 degrees of a larger circle. Hence, the term "toroid" as used herein is used in a broad context and is intended to embrace all such geometries. It will also be understood that the core 16 need not be a solid formed in the shape of a closed figure that is revolved around an axis at a fixed distance but instead may have straight lines or irregular curves. Ovals and oblongs may be used, for example, as a generally toroidally-shaped core. These are closed solids with central openings but are not simple solids of revolution.

Turning now to the coil, in preferred device 10 the coil is implemented by wrapping in a helical fashion the first winding 20 of an insulated conductor, preferably insulated magnet wire, around core 16 of nonmagnetic core material. This first winding 20 extends substantially around the full perimeter (i e, substantially 360 degrees) of the core to make a complete layer of turns. Thus, it has a pitch in a first direction. At the last turn, the winding advancement reverses and returns in a helical fashion to create the return winding 22 which forms a second layer. Preferably the return winding 22 has a pitch in a second direction opposed to the first direction. More specifically, if the pitch of the first winding 20 is, illustratively positive X degrees from a radius of core 16, then the return winding can have a pitch of approximately negative X degrees from the radius. The second winding 22 is completed when the beginning of the first winding 20 is reached.

The problem of return path cancellation is substantially solved by adding the second winding 22 that closely approximates an ideal return path. The second winding 22 overlaps and crosses the path of the first winding 20 in the reverse direction. The approximation of the return path is improved by the use of small diameter wire, thus allowing a very large number of turns to finely approximate the effective center of the first winding 20 in small steps around the length of the coil. At lower turn densities, the opposite pitch angles between (forward) winding 20 and (reverse) winding 22 are quite pronounced. However, at very high turn densities, the forward winding 20 and reverse winding 22 are almost parallel. There is no absolute requirement for the number of turns per inch or the total number of turns to be the same for each winding 20, 22. In spite of this, it is likely that keeping the same number of turns per winding will prove to be advantageous for manufacturing. In addition, increasing the number of turns on the reverse winding 22 improves the implementation of the coil's return path. Moreover, this second winding 22 not only provides an excellent return path, but is also complementary with existing manufacturing methods. It should be noted that the ideal return path location is in the center of the first winding 20 around the length of the coil and as a result is more complex and difficult to manufacture if implemented directly.

Figure 4:
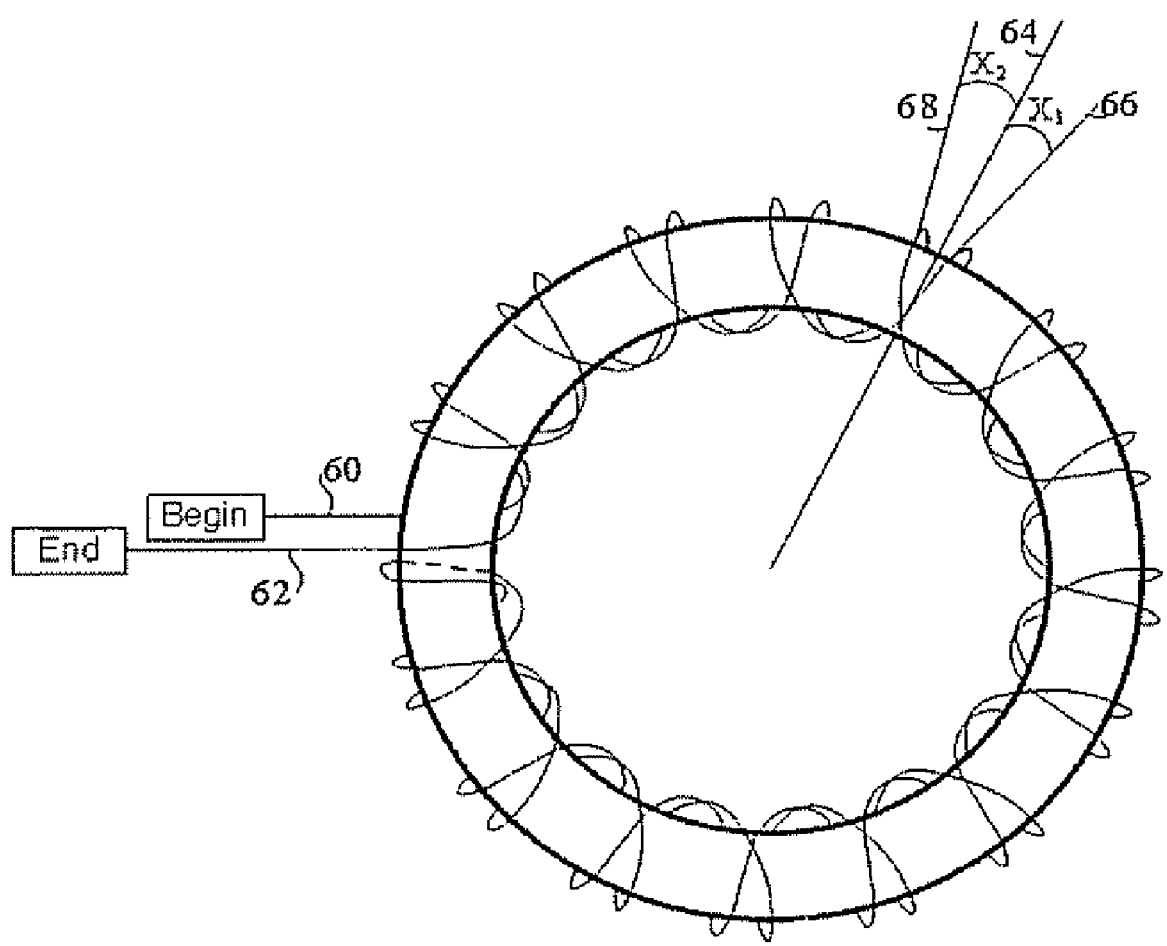
FIG. 4 is a representational sketch of the coil windings on the core of a the measurement device according to aspects of the present invention.

FIG. 4 is a sketch that shows representatively the direction of windings 20, 22 on a circular core in an application of the present invention. As can be seen, the first winding 20, which will be the inner winding, starts at a beginning point 60 and wraps around core 16, making turns that advance overall in a clockwise direction with respect to the view of FIG. 4. As noted, the wire makes numerous turns around core 16 as it extends around substantially 360 degrees forming the first winding 20. When the wire substantially covers all 360 degrees around the core, it reverses direction to form the second winding 22. Second winding 22 advances generally in the counter-clockwise direction and lies on top of first winding 20 at points where second winding 22 crosses over the wire forming the first winding 20. Otherwise, the second winding 22 may abut the core 16. When the wire returns substantially all 360 degrees, making illustratively an equal number of turns on the second winding 22 as the first winding 20, it reaches an end point 62. The first winding 20 may begin in either direction with the requirement that the second winding 22 is reversed in direction.

For illustrative purposes, a radial line 64 has been drawn in FIG. 4. The pitch of first winding 20 is represented by a first pitch line 66. The angle between the radial line 64 and first pitch line 66 is represented as angle X1. Similarly, the pitch of second winding 22 is represented by a second pitch line 68. The angle between the radial line 64 and second pitch line 68 is represented as angle X2. Preferably X1 equals X2. Illustratively, a core 16 of the 6.3 inch inside diameter, 8.2 inch outside diameter size is wound with 1,350 turns for first winding 20 and 1,350 turns for second winding 22. Thus, the pitch angle is, in such embodiment, a small fraction of one degree per turn. Preferably, for an equal number of turns per winding, the layers are "staggered" so that the wire for second winding 22 nests in troughs of the winding 20 along the inner and outer perimeter (inside and outside faces) of core 16.

The number of turns in the windings can be varied In the foregoing description and in the preferred embodiment, windings 20 and 22 have the same number of turns. This is not a strict requirement, however. It is preferable that there be either a match (or close match) or a significant disparity in the number of turns. For example, if the first winding 20 has 1,350 turns in the forward direction, the return loop formed by the second winding 22 may have about 1,350 turns or some much smaller number, e.g., 150 turns, 50 turns, or even 10 turns. When the second winding 22 has a much wider pitch than the first winding 20, each turn of the second winding 22 may traverse several turns of the first winding 20. The number of turns in the second winding 22 might not be critical but will most likely affect the approximation of the ideal return path. If, on the other hand, there is a near match in the number of turns, problems can develop. For example, if the first winding 20 has 500 turns and the second winding 22 has 400 turns, then the radius of the second winding 22 turns will vary due to some of the turns being elevated and others not. The unevenness or inconstancy in radius as between the two windings 20 and 22 is preferably avoided in implementing the present invention.

On the illustrative 6.3-8.2 inch flattened toroidal core 16, one may use approximately 0.039 inch wire placement pitch with 28-AWG heavy build magnet wire to obtain 500 turns for the first winding 20 and another 500 turns for the second (return loop) winding 22. Preferably with an equal or approximately equal number of turns for each layer, one can employ a gapped pitch and lay the two windings evenly between each other so that there is consistency in how the wires cross on the side (i.e., front and back) faces 50 of core 16. The first and second windings 20, 22 should appear as one layer on the inner face 52 and the outer face 54 with regular alternation between the forward direction winding 20 and the reverse direction winding 22. Thus it will be understood that the windings can be applied with fully packed turns (where sequential turns of the same winding substantially touch one another), gapped layers (where sequential turns of the first winding 20 are separated by turns of the second winding 22), or where one winding has a significantly different number of turns than the other winding. The presently preferred arrangement uses turns that are about 1 millimeter apart when wrapped onto the 6.3-8.2 inch core. Coil winding apparatus for applying windings 20, 22 according to any desired pitch and separation is quite well known. According to one aspect of the present invention, the roughened surface of the core assists in retaining the turns of either the lower winding 20 or both windings 20 and 22 in their proper positions.

After the first and second (forward and return loop) windings 20, 22 are applied, an encapsulating sealant is applied to varnish the coil in order to provide a second layer of insulation beyond that of the conductor and moreover, for the purpose of locking the coil winding turns in place. An example of an encapsulating sealant for this purpose is a urethane, varnish, or silicon base material. One may use a vacuum impregnation process for this sealant, as used customarily for transformer windings. Further, the coil winding turns may be locked into place by means of a coating applied to the coil wires prior to their being placed on the core. For example, the wire used for the winding turns may include a bondcoat such as a polymer, epoxy, polyamide, butvar, or the like. The bondcoat may be solvent or heat activated such that after the wire used for the winding turns are placed on the core, the bondcoat may be activated to hold the turns in place or provide a layer of insulation beyond that of the conductor. In one embodiment, the bondcoat is a polyamide, which is heat activated after the winding turns have been placed on the core. Satisfactory results have been obtained using a conformal coating such as acrylated urethane applied to the coil after the windings have been applied on the core.

After the sealant is applied, an overlapping Faraday shield is applied to the insulated coil before fixing it within insulated case 12. While any form of shielding may be employed, according to another aspect of the present invention, the preferred shield is referred to as a "serpentine" shield 24 which has a central region and staggered tabs or lateral extensions which extend therefrom and wrap around portions of the core not covered by the central region. A portion of the shield 24 wrapped around core 16 is visible in FIG. 1B.

Figure 5:
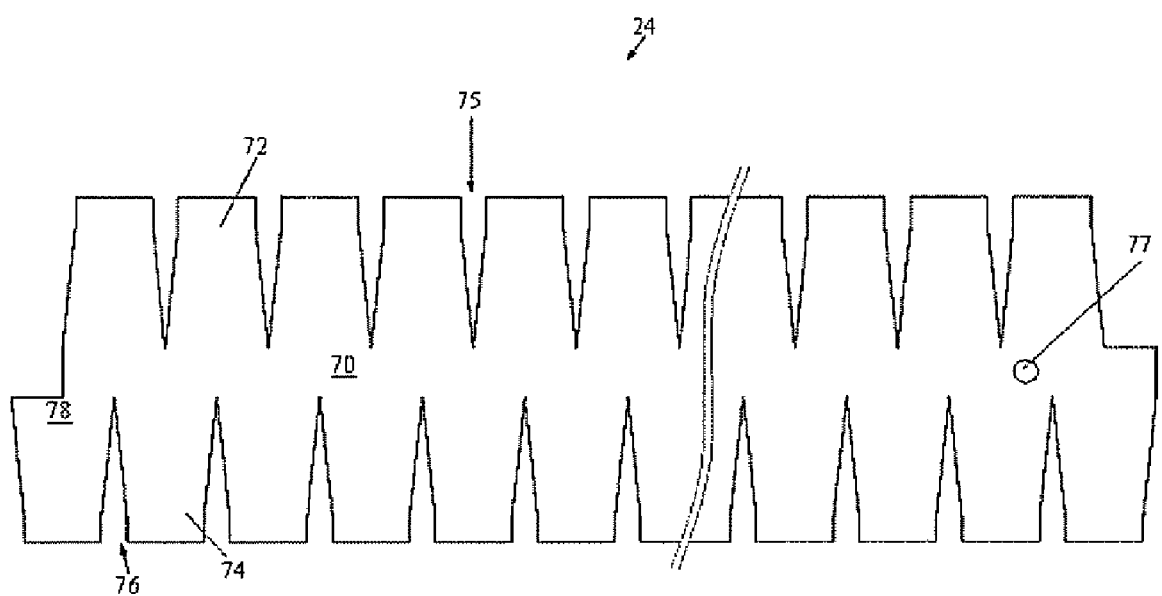
FIG. 5 shows a preferred Faraday shield used in the device of FIGS. 1A and 1B before the shield is affixed to the device.

FIG. 5 shows shield 24 in plan view before it is wrapped around the coil. As can be seen, in this view the general shape of shield 24 has "serpentine" or "zig-zag" features. That is, shield 24 includes a central region 70 extending horizontally in the orientation represented by FIG. 5. Central region 70 is flanked by lateral extensions 72 extending laterally upward from the top of central region 70 and by lateral extensions 74 extending downward from the bottom of central region 70. As seen in FIG. 5, extensions 72 and 74 are not aligned. Instead, extensions 72 are offset (staggered) from extensions 74 in the preferred embodiment. However, this staggering is not a required feature, and in another embodiment, the upper and lower extensions could be aligned with one another. A first space 75 exists between adjacent lateral extensions 72. A second space 76 exists between adjacent lateral extensions 74. As seen in FIG. 5, the outer portions of each space 75, 76 preferably includes two edges that are parallel to each other, and each of the two adjacent lateral extensions preferably converge at central region 70. Stated another way, each lateral extension 72, 74 in FIG. 5 has a fixed width where it first extends from central region 70. Over most of its span, the width of the lateral extension decreases constantly with increasing distance from region 70. At the outermost part of each extension 72 or 74, however, the width remains fixed. The purpose of spaces 75, 76 is to allow proper fitting of shield 24 around the core 16 with its windings 20, 22 in place and with no overlapping of adjacent lateral extensions. Extending laterally from one end of the central region 70 is an end tab 78 that is used for making an electrical connection. Tab 78 may optionally extend further from central region 70 than any of the extensions 72, 74. The offsetting of extensions 72 from extensions 74 gives shield 24 of the preferred embodiment the "serpentine" shape of FIG. 5 before applying it to the coil. The shield 24 may also include an aperture 77 through which the coil beginning 60 and ending 62 may pass.

The spaces 75 and 76 allow the smooth wrapping of the shield 24 around a partially flattened torus such as core 16, wrapped with windings 20, 22, in the preferred embodiment. Thus, it will be understood that when shield 24 is affixed to the wound core (that is, core 16 having windings 20, 22 applied thereto), the central region 70 of shield 24 generally covers the wire on the outside annular face 54 of the core. The lateral extensions 72, 74 wrap over the wire on the annular rounded corners 56 and side faces 50 of core 16. The converging edges of the spaces 75, 76 allow extensions 72, 74 to fit substantially without a gap around the sides of the wound core, and the outer portions of extensions 72, 74 in the preferred embodiment overlap on the inside face 52 and substantially cover the wire thereon. The lateral extensions 72 and 74 may overlap or abut each other on the inside face 52.

Figure 6:
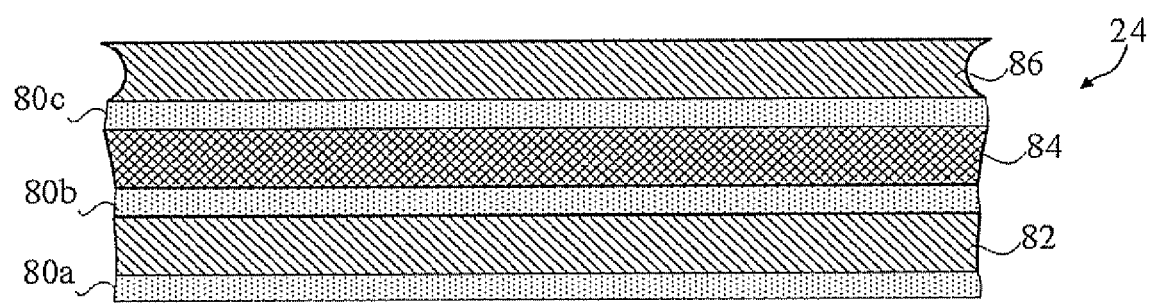
FIG. 6 shows the layers within the Faraday shield of FIG. 5.

FIG. 6 shows a cross section of the preferred shield 24, which preferably is a lamination of three primary layers with adhesive 80 (represented as 80a, 80b, and 80c in FIG. 6) on the bottom of each. At the bottom is adhesive 80a adhered to an insulative layer 82. Next is another adhesive 80b joining the top of layer 82 to the bottom of a non-ferromagnetic metal layer 84. Finally, there is a third adhesive layer 80c joining the top of metal layer 84 to the bottom of another insulative layer 86. In one embodiment, the shield 24 may be constructed without the top insulative layer 86. In this embodiment, the tab 78 does not need to have an insulative layer 86 removed in order to make an electrical contact. In the preferred embodiment, insulative layers 82 and 86 are 0.002 inch thick polyester. Preferably the metal layer 84 is 0.002 inch thick and made of aluminum or copper foil. The thicknesses and exact materials are not critical, and other non-ferromagnetic metals or alloys thereof can be used. In addition to any wire varnishes or sealants, the bottom layer of insulation provides a supplemental layer of protection from electrical contact with the coil winding conductors. In addition, the bottom layer of insulation in combination with the staggering of the opposite sides of lateral extensions 72, 74 prevents the metal layer of the shield from forming an electrical loop through or around the coil.

The metallic layer 84 is exposed at one end of the serpentine shield 24 so that an electrical connection can be made to it with a spring, threaded fastener, solder joint, or any other effective electrical or mechanical connection apparatus or method. Preferably, this exposed portion is at the end tab 78. This exposed tab 78 of the shield 24 extends beyond the coil and is adhered to the bottom of housing 12 with the conductive area of layer 84 facing out.

Figure 7A:
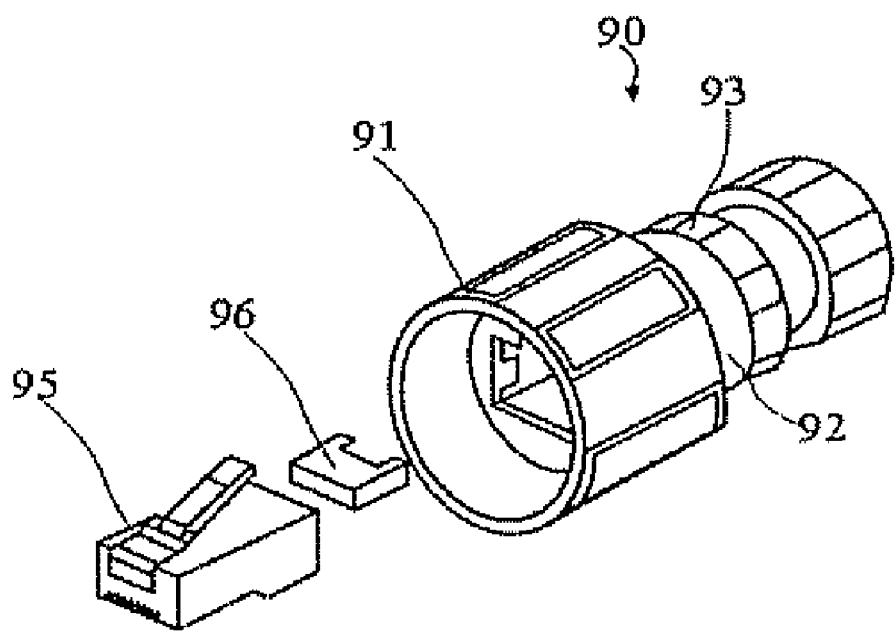
FIGS. 7A and 7B show an electrical connector that is used at the end of the output wire for the device of FIGS. 1A and 1B.
Figure 7B:
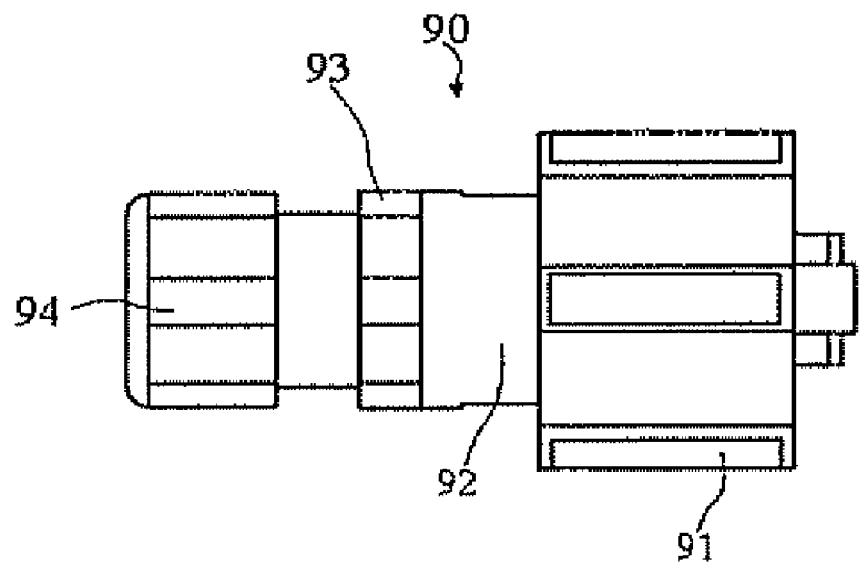

The compensation and scaling network 26 on circuit board 13 within housing 12 includes electrical circuitry for managing scaling, over-voltage protection, and temperature compensation. Network 26 is coupled electrically to the coil beginning 60 and ending 62. Preferably, the output of network 26 is carried on cable 28. Preferably, cable 28 is a shielded, twisted-pair cable that passes through a small hole 34 in housing 12 and is terminated with an industrial-grade connector shown in FIGS. 7A and 7B. The specific connector is not critical, but the presently preferred connector is an industrial circular Ethernet connector 90 such as a Tyco electronics solid wire plug kit 1738607-1 which uses an RJ-45 plug. The illustrated connector 90 has a coupling ring 91 around an annular body 92, forward of a cable fitting 93 and rear portion 94. Shielded by coupling ring 91 is an end connector 95 associated with a load bar 96.

The temperature compensation is helpful because of the physical expansion of the coil materials and the resulting change in signal gain. The output signal scaling is included primarily for calibration and attenuation. Since the output of a Rogowski coil is proportional to the magnitude of di/dt and the total cross-sectional area of the windings, signal scaling is implemented in order to calibrate the signal output against a specific known input reference, in this implementation, a known AC current. In addition, signal attenuation is required in order to accommodate the dynamic range of any downstream microelectronic processing circuitry and possibly to prevent the output voltage from exceeding accepted human safety levels. At sufficiently high current levels, the total cross-sectional area of the turns around the coil is high enough to create voltages that are beyond the human safe-to-touch level as defined by IEC and UL standards. As a result, the illustrative device 10 includes voltage clamping and an optional ground connection 30 to supplement the attenuation of the output signal scaling. It should be noted that device 10 takes advantage of the high gain of the coil prior to attenuation by using this excessive coil gain, or sensitivity, to substantially overwhelm any external sources of error.

The temperature sensitivity of the completed coil can be modeled as a temperature dependent AC voltage source. The temperature coefficient of gain, G, is approximately linear and based upon the change in the effective cross-sectional area of the completed coil assembly versus the temperature of the coil assembly. The gain coefficient is affected by the coil materials, winding conductor, and winding encapsulated portions of the coil assembly. In addition, the resistance of the coil winding, $R_{coil}$, increases with temperature based on the temperature resistivity coefficient, $y_{cu}$, of the winding conductor. The temperature compensation and signal scaling electrical network can be used to null the positive gain coefficient of the AC voltage source against the positive resistivity coefficient while simultaneously calibrating and attenuating the signal output.

Figure 8:
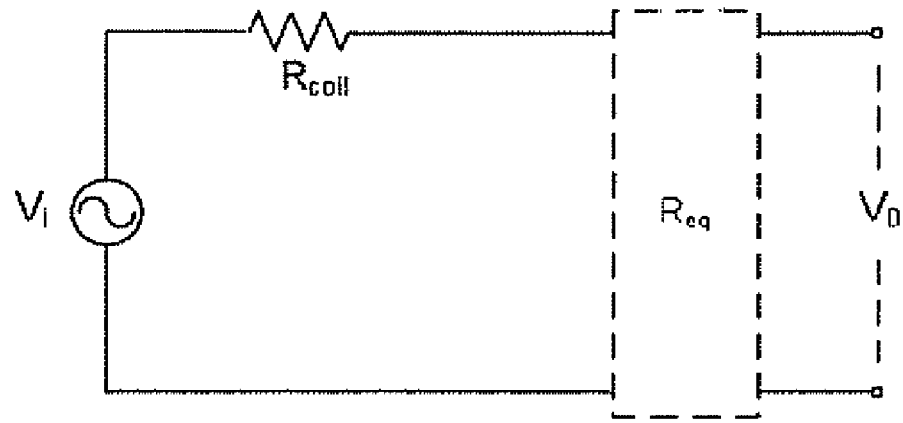
FIGS. 8, 9, and 10 are electrical circuit diagrams used in explaining the compensation circuitry included in the device of FIGS. 1A and 1B.

In order to model the electrical network, the requirement for the coil's temperature compensation must be determined. With reference to FIG. 8, the following parameters are defined:

G=temperature dependant voltage gain of the completed coil assembly $y_{cu}$=temperature resistivity coefficient of Copper $R_{coil}$=resistance of the coil windings $V_i$=AC voltage from the coil $R_{eq}$=equivalent resistance of compensation and scaling network seen by the coil T=temperature $V_o$=AC voltage output after compensation and scaling K=scaling constant representing the calibration and attenuation produced by $R_{eq}$ Including the temperature dependency of $V_i$ and $R_{coil}$, the transfer function for this circuit can be written as:

$$\frac{V_o}{V_i} = \frac{R_{eq} \cdot (1 + G \cdot T)}{R_{eq} + R_{coil} \cdot (1 + y_{cu} \cdot T)} \quad \text{(Equation 1)}$$

Setting the temperature dependent gain equal to the non-temperature dependent gain and solving, yields an equation of the necessary ratio of $R_{eq}$ to $R_{coil}$ to nullify the temperature dependency:

$$R_{eq} = \left(\frac{y_{cu}}{G} - 1\right) \cdot R_{coil} \quad \text{(Equation 2)}$$

Figure 9:
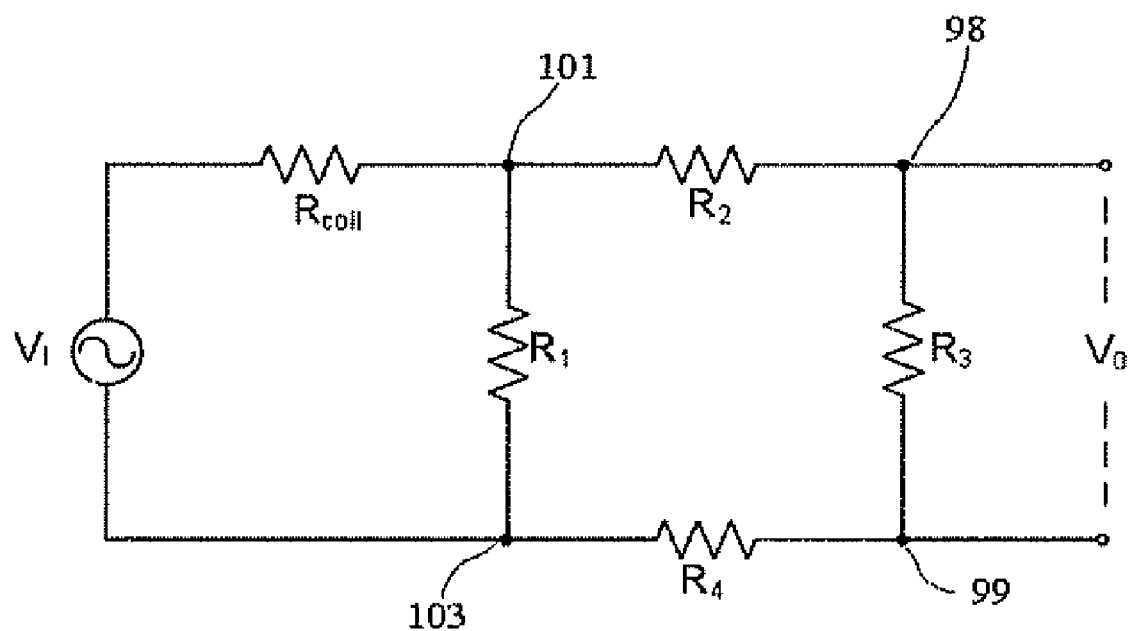

The equivalent resistance, $R_eq$, is the burden that must be placed on the coil by the compensation and scaling network. A balanced resistive network is illustrated in FIG. 9, where this equivalent resistance is split into four separate resistors, $R_1, R_2, R_3$, and $R_4$, in order to implement the scaling network necessary to calibrate and attenuate the coil output. Resistors $R_1, R_2, R_3$, and $R_4$ form a balanced attenuation network optimized for driving a shielded twisted pair transmission cable. Balanced termination provides advantages at higher frequencies (>10 kHz), The resistive network of FIG. 9 includes two output nodes 98 and 99, and nodes 101, 103 that couple to ends of the windings. Resistor $R_1$ is coupled between nodes 101 and 103. Resistor $R_2$ is coupled between node 101 and output node 98. Resistor $R_4$ is coupled between node 103 and output node 99 Finally, Resistor $R_3$ is coupled between output nodes 98 and 99. When high frequency behavior is not required, the attenuation network can be simplified by eliminating resistor R1 (R1=∞) and shorting resistor R4 (R4=0), thus yielding a simple network comprising only resistors R2 and R3 resulting in an unbalanced resistive network.

The equivalent resistance seen by the coil as a result of the compensation and scaling can be written as:

$$R_{eq} = \frac{R_1 \cdot (R_2 + R_3 + R_4)}{R_1 + R_2 + R_3 + R_4} \quad \text{(Equation 3)}$$

The transfer function representing the effects of the scaling resistors can be equated to a scaling constant, K, and written as:

$$\frac{V_a}{V_i} = K = \frac{R_1 \cdot R_3}{R_1 \cdot (R_2 + R_3 + R_4) + R_{coil} \cdot (R_1 + R_2 + R_3 + R_4)} \quad \text{(Equation 4)}$$

One of the possible solutions to determine the correct values for the scaling network is to simplify the expressions by letting:

$R_1 = R_3$ $R_2 = R_4$

Figure 10:
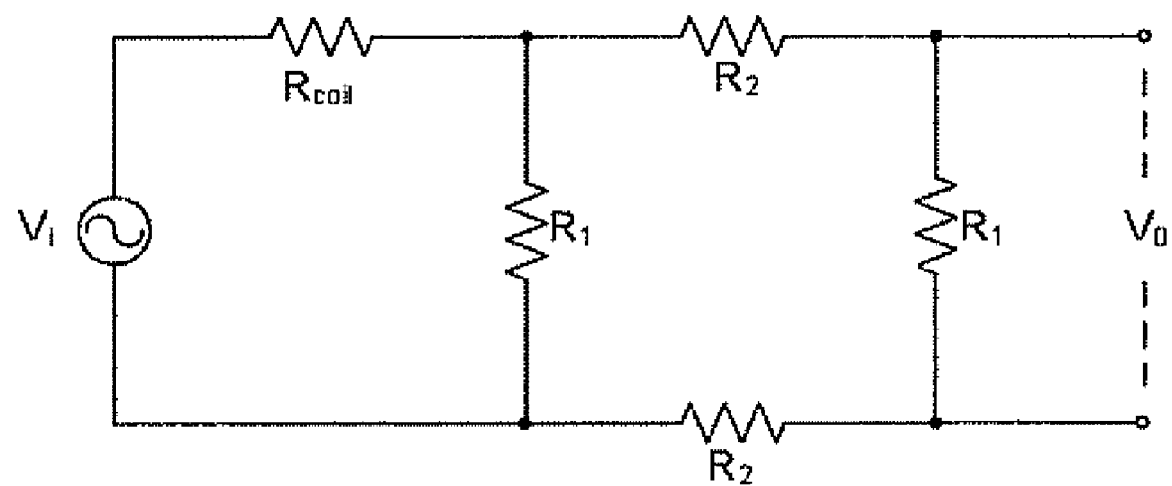

This is represented in FIG. 10. Thus, the equations for the equivalent resistance, $R_{eq}$, and the scaling constant, K, become:

$$R_{eq} = \frac{R_1^2 + 2 \cdot R_1 \cdot R_2}{2 \cdot R_1 + 2 \cdot R_2} \quad \text{(Equation 5)}$$

$$K = \frac{R_1^2}{R_1 \cdot (R_1 + 2 \cdot R_2) + R_{coil} \cdot (2 \cdot R_1 + 2 \cdot R_2)} \quad \text{(Equation 6)}$$

Since the $R_{eq}$, K, and $R_{coil}$ values are easily determined or measured, the equations for $R_{eq}$ and K may be combined and solved for the 2 unknowns, $R_1$ and $R_2$:

$$R_1 = K \cdot R_{coil} + (K+1) \cdot R_{eq} \quad \text{(Equation 7)}$$

$$R_2 = \frac{-1 \cdot (K \cdot R_{coil} + (K-1) \cdot R_{eq}) \cdot (K \cdot R_{coil} + (K+1) \cdot R_{eq})}{2 \cdot K \cdot (R_{coil} + R_{eq})} \quad \text{(Equation 8)}$$

The resulting resistance values are incorporated into the compensation and scaling network along with the over-voltage clamping circuit (bidirectional zener diode, MOV or similar clamping element) and placed inside the coil assembly on a small printed circuit, 13.

In addition to the resistors and clamp, the electrical circuit includes terminating connections for the coil electrostatic shield (Faraday shield 24), the coil winding wires (20, 22), the interface cable signal wires 28, and the interface cable drain wire. The connection of the coil electrostatic shield 24 to the electrical circuit can be simplified by the use of a conductive spring 100 shown in FIGS. 11A and 11B. This spring makes a physical and electrical connection between a conductive area on the bottom side of the electrical circuit and the exposed conductive area on the electrostatic shield that is affixed to the bottom of the insulated case. The optional ground lug 30 is made electrically common with the shields in this electrical circuit area also.

The housing 12 isolates all internal components except for the ground lug. The exit 34 of interface cable 28 from the case is sealed, and the end of cable 28 is terminated with an industrial connector 90.

Figure 12B:
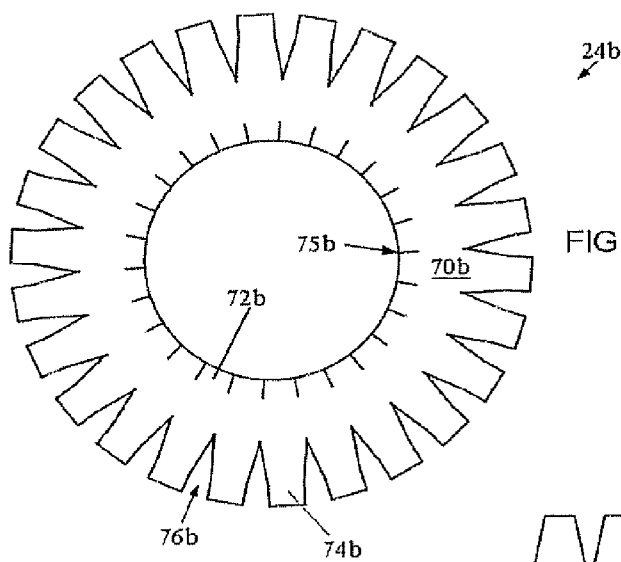
FIGS. 12A and 12B show alternative versions of the Faraday shield illustrated in FIG. 5, which may be used in the device of FIGS. 1A and 1B.
Figure 12A:
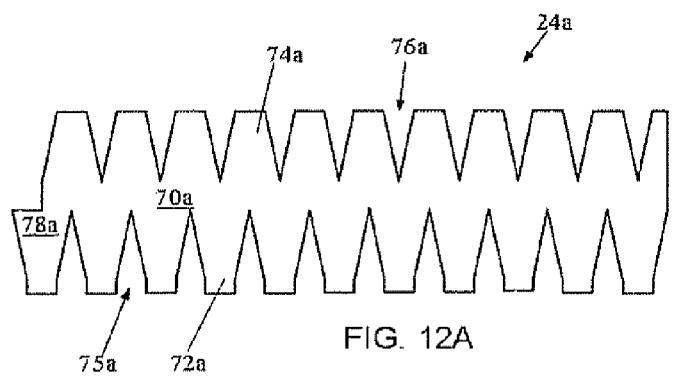

FIG. 12A shows an alternate Faraday shield 24a that may be used in place of the one shown in FIG. 5. The alternate embodiment shown in FIG. 12A also has the general "serpentine" or "zig-zag" features of the FIG. 5 embodiment. However, in FIG. 12A the lateral extensions 74a on one side of the central region 70a are not identical in shape to the lateral extensions 72a on the opposite side of the central region 70a. In particular, lateral extensions 74a have a constantly decreasing width with increased distance from the central region 70a, and the other set of lateral extensions 72a have such a constantly decreasing width followed by a small constant width at the outer portion of the lateral extension (as in the FIG. 5 embodiment). In addition, the lateral extensions on one side of central region 70a may be shorter than the lateral extensions on the opposite side of central region 70a. Because the lateral extensions 74a have a different shape than the lateral extensions 72a, the spaces 76a between the lateral extensions 74a have a different shape than the spaces 75a between the lateral extensions 72a.

FIG. 12B shows yet another alternate Faraday shield 24b that may be used in place of the one shown in FIG. 5. This Faraday shield 24b has a circular or star shape instead of the serpentine or zig-zag shape of the shields 24, 24a in FIGS. 5 and 12A. This shield 24b includes a central region 70b flanked by outward extensions 74b extending outward of the central region 70b and inward extensions 72b extending inward of the central region 70b. A first space 75b exists between adjacent inward extensions 72b. In one embodiment, the first space 75b may be a cut or a slice. A second space 76b exists between adjacent outward extensions 74b. The shield 24b may be affixed to the wound core (that is, core 16 having windings 20, 22 applied thereto), and the central region 70b of shield 24b generally covers the wire on a side face 50 of the core 16. The outward extensions 74b wrap over the wire on the annular face 54 and the other side face 50 of the core 16. The inward extensions 72b wrap over the wire on the inside face 52 of the core 16. The spaces 76b, 72b allow for the shield 24b to be applied to the wound core such that there is substantially no overlapping between adjacent outward extensions 74b or adjacent inward extensions 72b. Further, the outward extensions 74b may overlap the inward extensions 72b when applied to the wound core, if the inward extensions 72b are applied to the wire on the inside face 52 before the outward extensions 74b are applied to the wire on the annular face 54 and the other side face 50, and extend onto the inside face 52. Alternatively, the inward extensions 72b may overlap the outward extensions 74b when the outward extensions 74b are applied to the wire on the annular face 54 and the other side face 50, and extend onto the inside face 52 before the inward extensions 72b are applied to the wire wound on the inside face 52 of the core 16.

The completed Rogowski Coil constructed according to the preferred embodiments has the following attributes. It has a wire wound construction instead of being a printed circuit type. It has an optimized return path approximation and a wide frequency response. It uses no magnetic core and has no stored energy danger. Its metering precision can surpass 0.3%. It has a temperature compensated output and an integrated calibration network. It is electrostatically shielded and is provided in an insulated package. It has wide temperature performance from minus 45 to (positive) 85 degrees Centigrade. It has an integrated twisted-pair, shielded cable and uses an industrial connector interface.

It will be evident that other modifications or variations can be made within the scope and spirit of the present invention. While the invention has been described in conjunction with specific illustrative embodiments, those embodiments are not intended to limit the scope of the present invention, the scope of which is set forth in the accompanying claims which are intended to embrace alternatives, modifications, and variations which fall within the spirit and scope of the invention.

The invention claimed is:

1. An electric current measuring device of the type using a coil and comprising:
   a core including a plurality of cavities therein;
   a conductive coil wound about the core to form a first winding in a first direction and a second winding constituting a return winding, and
   a Faraday shield extending around the core, outside of the coil, and comprises a first insulation layer and a non-ferromagnetic metal layer.

2. The electric current measuring device of claim 1 further comprising a coating layer securing the position of the coil.

3. The electric current measuring device of claim 1 wherein the core is made of a non-magnetic insulating material.

4. The electric current measuring device of claim 1 wherein the core is generally toroidally-shaped.

5. The electric current measuring device of claim 1 wherein the core is generally toroidally-shaped, having flattened side faces and includes an inside annular face having a first radius from a center point and an outside annular face having a second radius from the center point, the second radius being larger than the first radius.

6. The electric current measuring device of claim 5 wherein the core further comprises rounded corners between the annular faces and the side faces.

7. The electric current measuring device of claim 1, wherein the conductive coil comprises magnet wire.

8. The electric current measuring device of claim 1 wherein the return winding has substantially the same number of turns as the first winding.

9. The electric current measuring device of claim 1 further comprising a resistive network electrically coupled to the conductive coil.

10. The electric current measuring device of claim 1, wherein the second winding comprises a return winding wrapped on top of the first winding coil in a reverse direction of advancement as the first winding.

11. The electric current measuring device of claim 1 wherein the Faraday shield comprises a central region with first and second lateral extensions extending in opposite lateral directions from the central region.

12. The electric current measuring device of claim 11 wherein the first and second lateral extensions are offset from one another so that they generally have a serpentine orientation when flat.

13. The electric current measuring device of claim 1 wherein the Faraday shield further comprises a second insulation layer, wherein the metal layer is positioned between the first and second insulation layers.

14. The electric current measuring device of claim 13 further comprising an adhesive positioned at lower faces of each of the first and second insulation layers and the metal layer.

15. The electric current measuring device of claim 1 wherein the Faraday shield has a portion coupled electrically to an electric grounding terminal.

16. An electric current measuring device of the type using a coil and comprising:
    a core;
    a conductive coil wound about the core to form a first winding in a first direction and a second winding constituting a return winding;
    a Faraday shield extending around the core, outside of the coil; and,
    a coil attenuation, calibration, and temperature compensation circuit using a resistive network electrically coupled to the first winding and the second winding of the coil.

17. The electric current measuring device of claim 16, wherein the resistive network comprises a balanced resistive network.

18. The electric current measuring device of claim 17, wherein the balanced resistive network includes first and second output nodes, and comprises:
    first and second nodes coupled to ends of the first and second windings;
    first, second, third, and fourth resistors;
    wherein the first resistor is coupled between the first and second nodes;
    wherein the second resistor is coupled between the first node and the first output node;
    wherein the third resistor is coupled between the first and second output nodes; and
    wherein the fourth resistor is coupled between the second node and the second output node.

19. The electric current measuring device of claim 16, wherein the resistive network comprises an unbalanced resistive network.

20. The electric current measuring device of claim 19, wherein the unbalanced resistive network includes first and second output nodes, and comprises:
    first and second nodes coupled to ends of the first and second windings;
    first and second resistors;
    wherein the first resistor is coupled between the first node and the first output node; and
    wherein the second resistor is coupled between the first and second output nodes, and coupled to the second node.

21. The electric current measuring device of claim 1 further including an insulated housing surrounding and supporting the coil and the Faraday shield.

22. The electric current measuring device of claim 21 further including an interface cable and wherein the housing includes an aperture receiving the interface cable.

23. The electric current measuring device of claim 1 wherein at least a portion of the core has a rough surface.

24. The electric current measuring device of claim 1 wherein the core is injection molded.

25. The electric current measuring device of claim 1 wherein the core is machined.

26. The electric current measuring device of claim 1 wherein the first and second windings are generally helically wrapped substantially around the full perimeter of the core.

27. A core for a coil comprising:
    a core made of a non-magnetic material configured in a geometric shape;
    a plurality of cavities extending from an outer surface of the core into the core, the cavities being concentric with the core, and
    a structural rib.

28. The core according to claim 27, wherein the core is generally toroidally shaped.

29. The core according to claim 27, wherein the core has a circular plan view.

30. The core according to claim 27, wherein the structural rib is disposed in a radial direction.

31. The core according to claim 27, wherein the structural rib is concentric with the core.

* * * * *